United States Patent [19]
Liao

[11] Patent Number: 6,111,293
[45] Date of Patent: *Aug. 29, 2000

[54] SILICON-ON-INSULATOR MOS STRUCTURE

[75] Inventor: Kuan-Yang Liao, Taipei, Taiwan

[73] Assignee: United Silicon Incorporated, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/076,362

[22] Filed: May 11, 1998

[30] Foreign Application Priority Data

Feb. 16, 1998 [TW] Taiwan ................... 87102079

[51] Int. Cl.[7] ................... H01L 27/01
[52] U.S. Cl. ............ 257/347; 257/349; 257/373; 257/382; 257/396
[58] Field of Search ................... 257/347, 902, 257/348, 349, 382, 383, 384, 396, 372, 373, 374, 352, 354; 438/149, 151

[56] References Cited

U.S. PATENT DOCUMENTS

| | | | |
|---|---|---|---|
| 4,271,424 | 6/1981 | Inayoshi et al. | 257/902 |
| 5,243,213 | 9/1993 | Miyazawa et al. | 257/350 |
| 5,489,792 | 2/1996 | Hu et al. | 257/347 |
| 5,698,869 | 12/1997 | Yoshimi et al. | 257/192 |
| 5,763,904 | 6/1998 | Nakajima et al. | 257/66 |
| 5,818,085 | 10/1998 | Hsu et al. | 257/347 |
| 5,869,874 | 2/1999 | Manning | 257/382 |
| 5,929,490 | 7/1999 | Onishi | 257/347 |
| 5,945,712 | 8/1999 | Kim | 257/347 |

FOREIGN PATENT DOCUMENTS

| | | | |
|---|---|---|---|
| 5-75119 | 3/1993 | Japan | 257/347 |

*Primary Examiner*—David Hardy
*Assistant Examiner*—George C. Eckert, II
*Attorney, Agent, or Firm*—Christie, Parker & Hale, LLP

[57] ABSTRACT

A silicon-on-insulator metallic oxide semiconductor structure having a double implanted source region. By etching a trench contact window in the double implanted source region and then depositing a metal into the trench to form a metal plug, contact between the source terminal and the substrate is established. Consequently, floating body effect of a silicon-on-insulator device is prevented without having to provide additional surface area to accommodate the contact window.

16 Claims, 4 Drawing Sheets

SILICON-ON-INSULATOR MOS STRUCTURE

CROSS-REFERENCE TO RELATED APPLICATION

This application claims the priority benefit of Taiwan application serial no. 87102079, filed Feb. 16, 1998, the full disclosure of which is incorporated herein by reference.

BACKGROUND OF THE INVENTION

1. Field of Invention

The present invention relates to a silicon-on-insulator device structure. More particularly, the present invention relates to a silicon-on-insulator metallic oxide semiconductor (MOS) structure.

2. Description of Related Art

Silicon-on-insulator (SOI) structure is a technique for isolating complementary MOS (CMOS) transistors from a substrate. The principle is to establish a layer of insulating material (in general a silicon dioxide layer) not far away from the surface of a silicon substrate, thereby isolating a layer of substrate silicon from the main substrate body below. A CMOS transistor can then be fabricated on the isolated substrate silicon layer above the insulating layer, and hence the structure is called silicon-on-insulator. Since the area for fabricating the CMOS transistor is isolated from the substrate main body, certain conventional latch-up paths will be excluded. For example, conventional latch-up paths such as "source terminal to the substrate" and "well region to the substrate" no longer exist due to the isolation provided by this insulating layer.

The SOI structure can be fabricated using isolation by implanted oxygen (SIMOX) method, bonded wafer method or dielectric isolation (DI) method. The advantages of having a SOI structure, other than being capable of reducing parasitic bipolar effects of a CMOS transistor, include the ability to increase its immunity to soft errors caused by powerful α-particles. Furthermore, since the permitted line width is smaller, the level of integration can be increased. In addition, since the number of masks necessary for fabricating a device for a SOI structure is fewer, the manufacturing process is very much simplified. The reduction of parasitic bipolar effects together with the reduction of device dimensions further boost the operational speed of the circuit.

FIG. 1 is a cross-sectional view showing a MOS device on a conventional silicon-on-insulator structure. The method of fabrication includes the steps of first defining an active device region out of a silicon main body 100 by a device isolating structure 102. Then, a buried oxide layer 104 is formed in the silicon main body 100. Next, a P-type silicon substrate 100a is formed above the buried oxide layer 104, and then a gate terminal 106, for example, of a MOS transistor, is formed above the P-type silicon substrate 100a. Finally, N-type source region 108a and drain region 108b are formed on each side of the gate terminal 106.

In the aforementioned SOI device, the P-type silicon substrate 100a is in a floating state. Therefore, unwanted current can easily flow between the drain region 108b and the source region 108a due to the transfer of electrons at the interface between the source region 108a and the P-type silicon substrate 100a. This is the so-called floating body effect, and will affect the functionality of the device as well as lowering its reliability. Hence, a tie down voltage is often connected to the P-type silicon substrate 100a in order to reduce the floating body effect. However, part of the SOI device area is usually sacrificed for each of the methods for connecting with the P-type silicon substrate 100a. FIG. 2 is a top view showing the structural layout of a conventional SOI device. As shown in FIG. 2, a source region 202a and a drain region 206b are formed on each side of a gate terminal 200. To connect the P-type silicon substrate 100a as shown in FIG. 1 to a tie down voltage, an extension area 204 is needed above the SOI device region as shown in FIG. 2. Furthermore, there is a contact window 206 above the extension area 204 for supplying the necessary low tie down voltage to the P-type silicon substrate 100a. This extension area 204, however occupies useful device space, thereby lowering the level of device integration. This is a highly undesirably state of affair in the fabrication of integrated circuits.

In light of the foregoing, there is a need to improve the conventional method of fabricating a SOI device.

SUMMARY OF THE INVENTION

Accordingly, the present invention is to form a double implanted source region and a metal plug after etching out a contact window through the source region. Consequently, the source terminal and the silicon substrate are electrically connected together through the metal plug, and so the floating body effect of a SOI device is avoided without increasing the area of occupation by the device. Hence, the level of integration can be increased without compromising its electrical properties.

To achieve these and other advantages and in accordance with the purpose of the invention, as embodied and broadly described herein, the invention provides a silicon-on-insulator MOS structure. The structure comprises a silicon substrate layer near the surface of a substrate main body separated from the substrate main body by a buried oxide layer; a gate terminal located above the silicon substrate; a source region formed on one side of the gate terminal, and having a double implanted structure formed by a first implantation and a second implantation; a drain region, formed on the other side of the gate terminal; a metal-filled source contact window passing through the region formed by the second implantation, and at least in contact with a portion of the source region formed in the first implantation, hence the source contact window is electrically coupled to the double implanted source structure; a metal-filled drain contact window in contact with at least a portion of the drain region, hence the drain contact window is electrically coupled to the drain region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
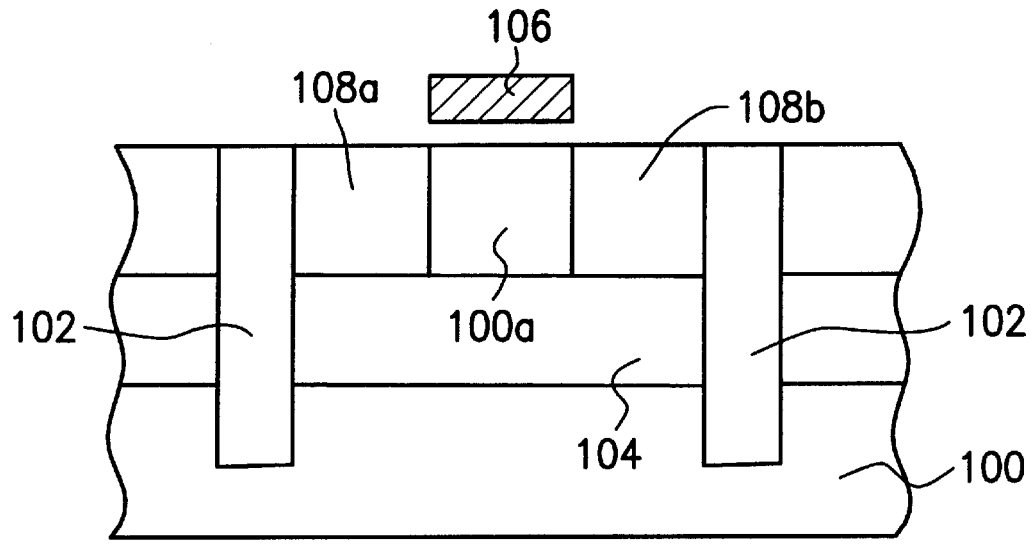
FIG. 1 is a cross-sectional view showing a MOS device on a conventional silicon-on-insulator structure.
Figure 2:
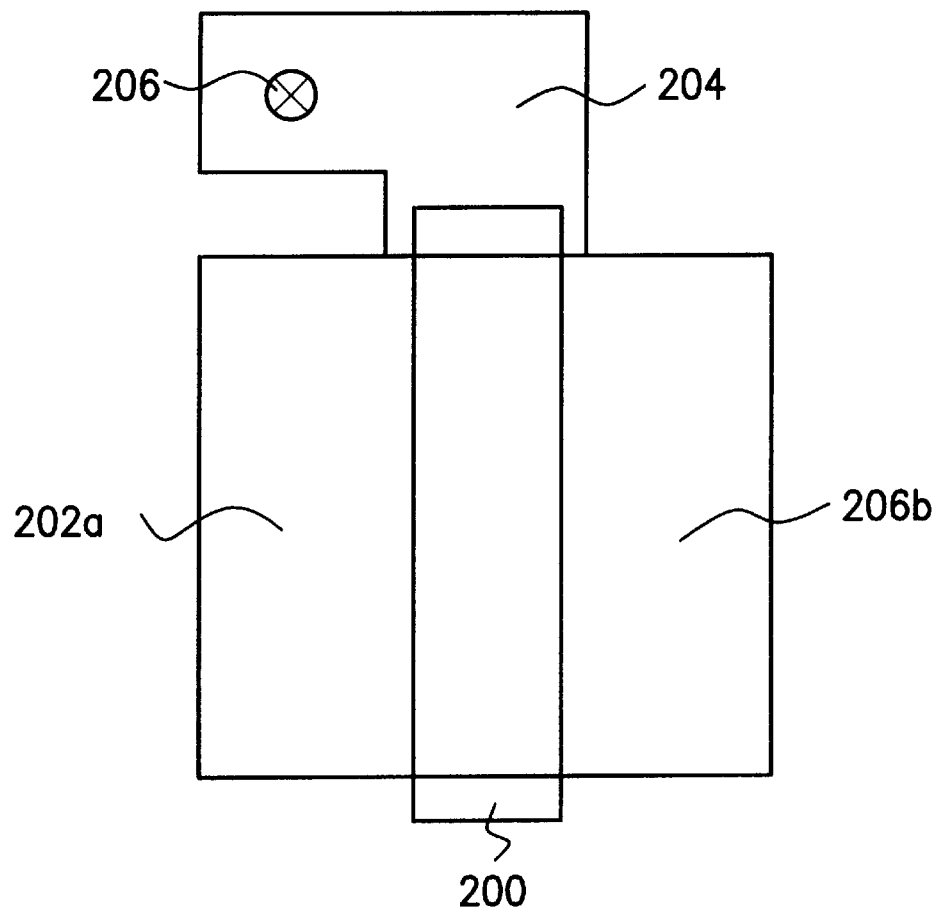
FIG. 2 is a top view showing the structural layout of a conventional SOI device.

Reference will now be made in detail to the presently preferred embodiments of the invention, examples of which are illustrated in the accompanying drawings. Wherever possible, the same reference numbers are used in the drawings and the description to refer to the same or like parts.

FIGS. 3A through 3E are cross-sectional views showing the progression of manufacturing steps in fabricating a MOS device on a silicon-on-insulator structure according to one preferred embodiment of this invention.

Figure 3A:
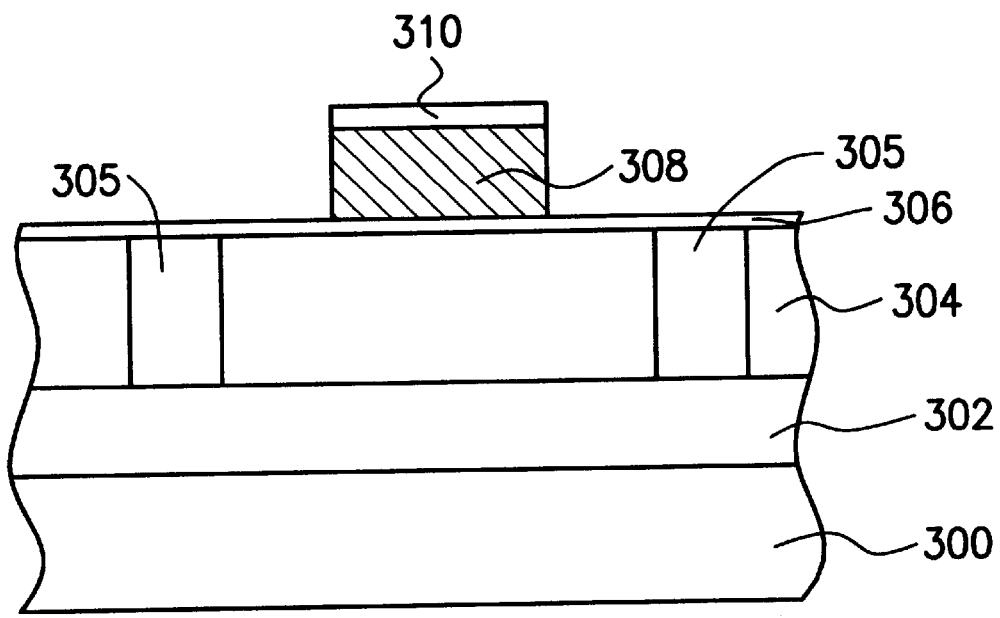
FIGS. 3A through 3E are cross-sectional views showing the progression of manufacturing steps in fabricating a MOS device on a silicon-on-insulator structure according to one preferred embodiment of this invention.

First, as shown in FIG. 3A, a buried insulating layer 302 is formed inside a silicon substrate using, for example, a SIMOX or an alternative method. The buried insulating layer 302, for example, an oxide layer, separates a silicon substrate 304 for device fabrication from a silicon main body 300. Next, the silicon substrate layer 304 is defined, then a portion of the silicon substrate 304 is removed and an oxide layer is deposited to form trenches 305 and a MOS transistor is formed in the silicon substrate 304. The gate of the MOS transistor is formed by first depositing a gate oxide layer 306 over the silicon substrate 304, and then depositing a polysilicon gate terminal 308 over the gate oxide layer. Finally, a silicon nitride layer 310 is formed over the gate terminal layer 308.

Figure 3B:
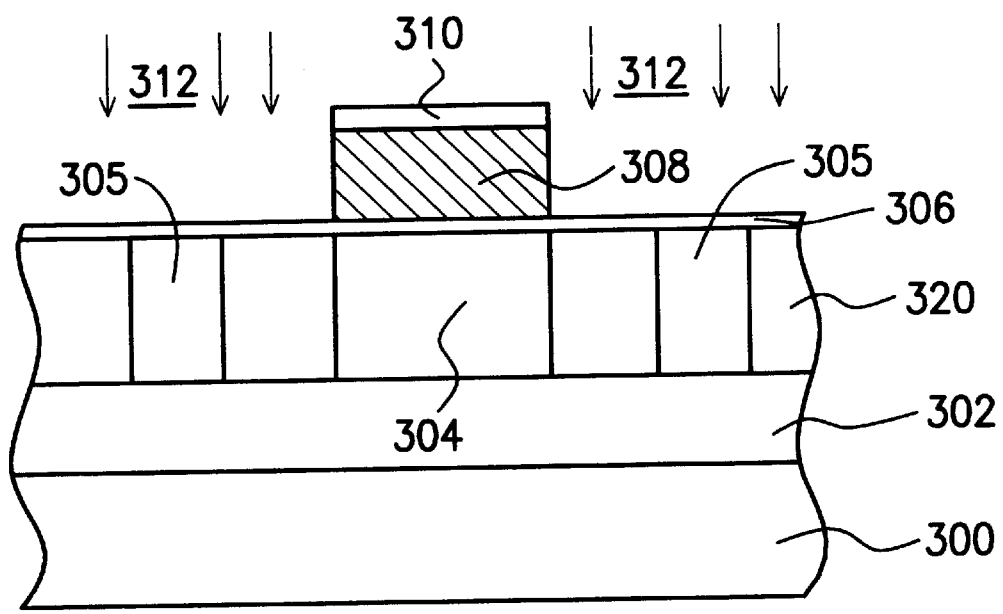

Next, as shown in FIG. 3B, using the silicon nitride layer 310 as a mask, a first ion implantation 312 is carried out implanting ions into the silicon substrate 304.

Figure 3C:
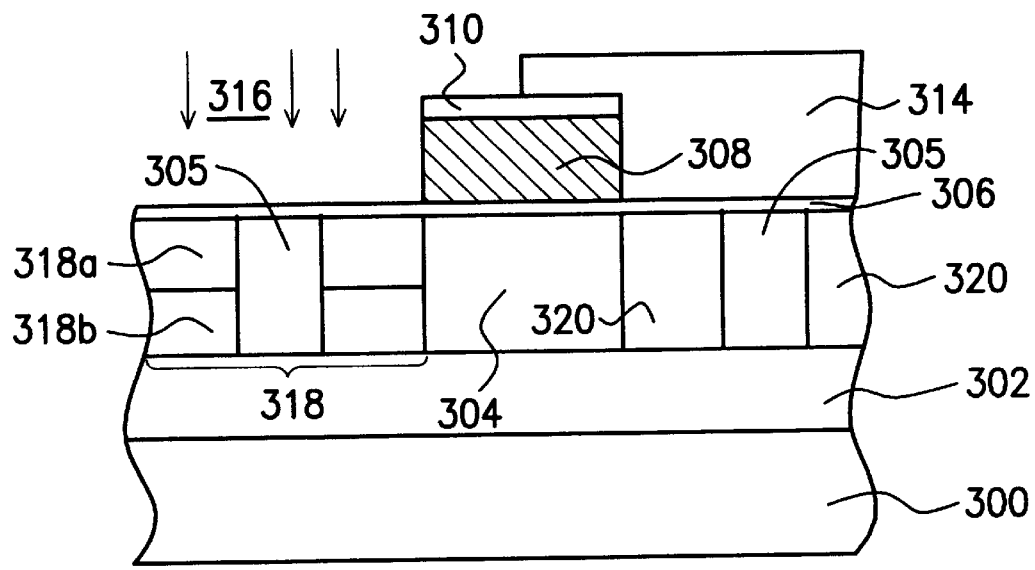

Thereafter, as shown in FIG. 3C, an implantation mask 314 is formed on one side of the silicon nitride layer 310. Then, a second ion implantation 316 is carried out implanting ions into the silicon substrate 304 on the exposed side. Thereafter, the implantation mask 314 is removed. Different ionic species are used in the first ion implantation and the second ion implantation. Therefore, a source region 318 having a double implanted structure and an ordinary drain region 320 are formed on opposite side adjacent to the gate terminal. The ions used in the first ion implantation are of the opposite type as the impurity doping in the silicon substrate 304. On the other hand, the ions used in the second implantation are of the same polarity to the impurity doping in the silicon substrate 304. The silicon substrate 304 preferably has a thickness of about 2000 Å, therefore the first implanted region 318a and the second implanted region 318b preferably has a thickness of about 1000 Å each. The first implanted region 318a and the second implanted region 318b preferably both extend an equal distance along a length of the source region.

Figure 3D:
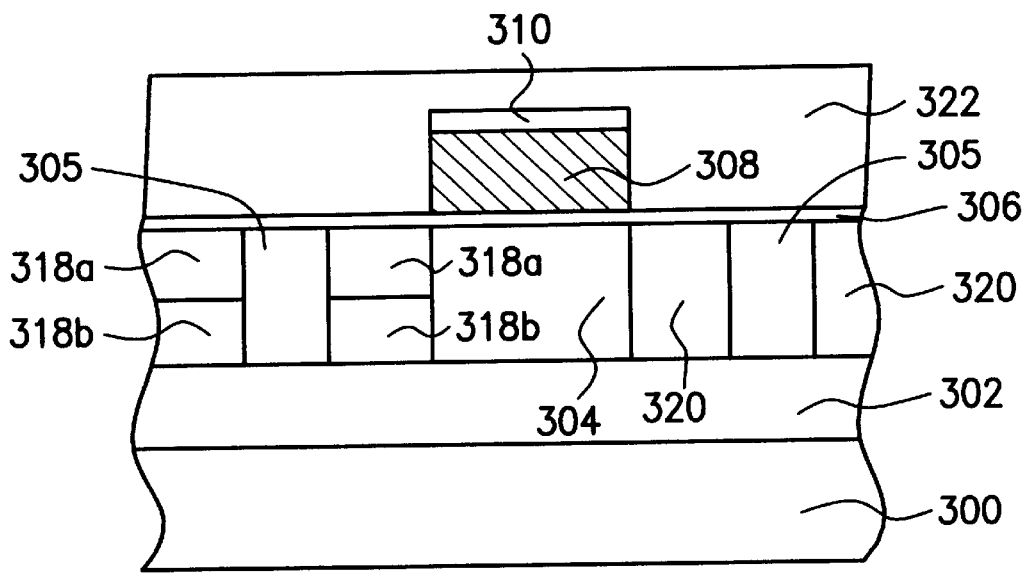

Thereafter, as shown in FIG. 3D, insulating material is deposited into the trenches and over the silicon nitride layer 310 to form an insulating layer 322 acting as an isolation structure between devices. In the subsequent step, the insulating layer 322 and the silicon substrate 304 are defined and then etched to form a trench that acts as a contact window. The buried insulating layer 302 is used as an etching stop so that the contact window runs through the entire thickness of the silicon substrate 304 and stops in layer 318b or exposes the buried insulating layer 302 below.

Figure 3E:
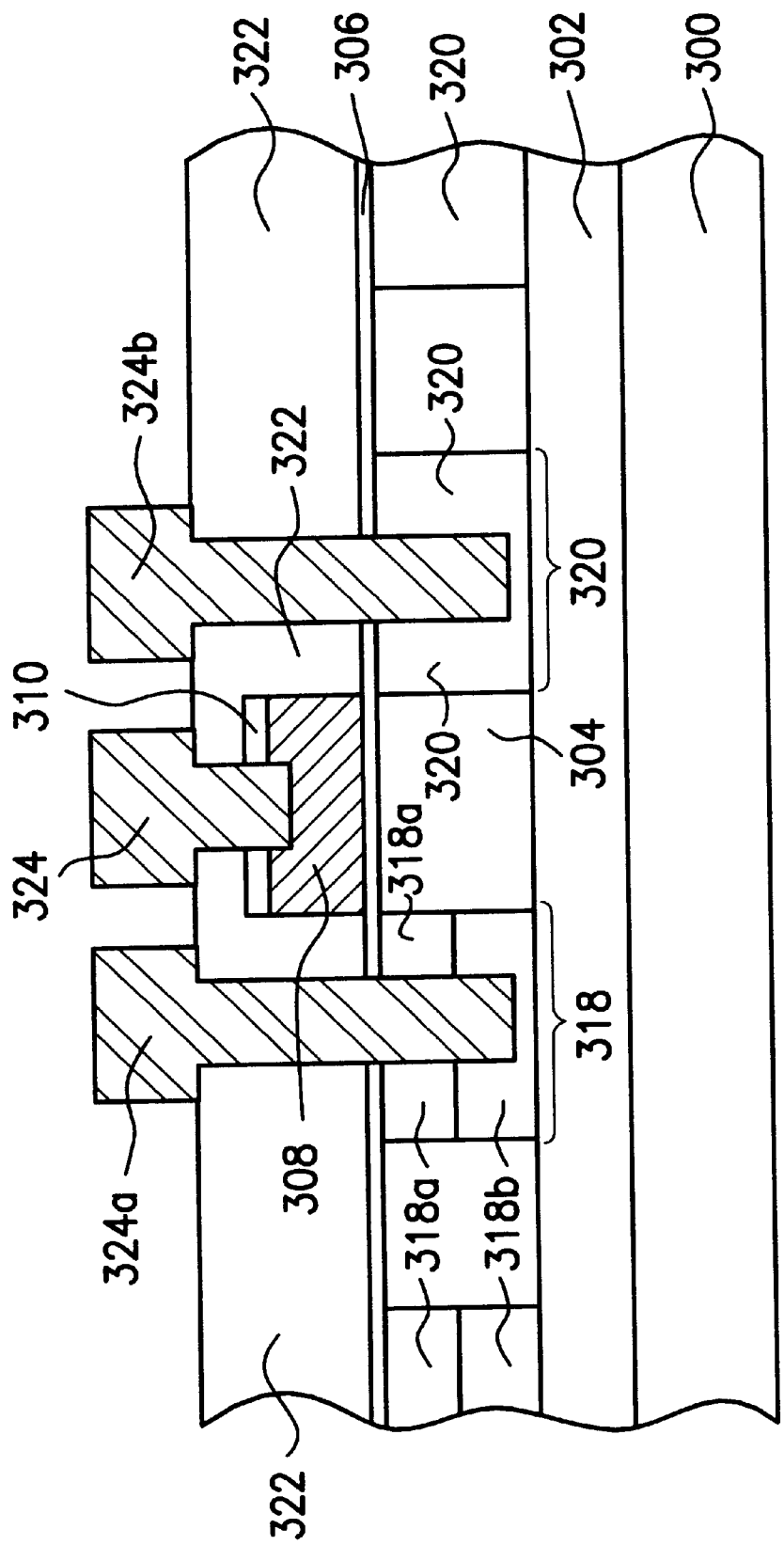

Lastly, as shown in FIG. 3E, metal is deposited into the source contact window to form a metal plug 324a. This metal plug 324a passes through and is surrounded by the first implanted region 318a in the source region 318 and is in contact with and is surrounded by at least a portion of the second implanted region 318b. The fist implanted region 318a has the same polarity as the silicon substrate 304 and is formed by the first ion implantation 312. The second implanted region 318b has the opposite polarity to the silicon substrate 304 and is formed by the second ion implantation 316. Therefore, the source contact window is electrically coupled with the first implanted region 318a and the second implanted region 318b. Hence, when a low tie down voltage is applied to the metal plug 324a, the voltage can get to the silicon substrate 304 via the second implanted region 318b, and also can get to the source region via the first implanted region 318a. On the other hand, metal is also deposited into a drain contact window forming a metal plug 324b. The metal plug 324b is in contact with at least part of the drain region 320, and so the drain region 320 is electrically coupled to the metal plug 324b.

As show is FIG. 3E, both the first implanted region 318a and the second implanted region 318b extend along the entire length of the source region 318.

For a PMOS device, the substrate is an N-doped silicon layer. In this case, P-type ions having a concentration level higher than the N-type substrate are implanted into the substrate in the source region to form the first implanted region. Consequently, N-type ions are implanted into the source region to form the second implanted region. Alternatively, for an NMOS device, the substrate is a P-doped silicon layer. In that case, N-type ions having a concentration level higher than the P-type substrate are implanted into the substrate in the source region to form the first implanted region. Consequently, P-type ions are implanted into the source region to form the second implanted region. Depth of implantation for the first and the second implanted layers can be adjusted, and is mainly determined by the energy level used in the ion implantation operation.

This invention utilizes a double ion implantation to form a doubly implanted source region, then forming a contact window that etches through the silicon substrate, and finally depositing metal into the contact window to form a metal plug. Therefore, separately implanted layers in the source region that have different electrical properties can be simultaneously connected through the metal plug. Hence, floating body effect can be prevented by a tie down voltage applied the source terminal, thereby increasing the reliability of device operation without consuming precious device area. Consequently, a higher level of integration and a more compact device structure can be realized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A silicon-on-insulator metallic oxide semiconductor structure comprising:
   a substrate having a silicon surface layer separated by a buried oxide layer, the silicon surface layer being doped with ions;
   a gate terminal formed above the substrate;
      a source region formed on one side adjacent to the gate terminal wherein the source region has a double implanted structure including a first implanted region and a second implanted region formed by a first implantation and a second ion implantation respectively, ions used in the first ion implantation being of an opposite polarity as the ions with which the silicon surface layer is doped and ions used in the second ion implantation being of a same polarity to the ions with which the silicon surface layer is doped, both the first implanted region and the second implanted region extending an equal distance along a length of the source region;

a drain region formed on the other side adjacent to the gate terminal;

a source contact window that passes through and is surrounded by the first implantation region and sinks into and is surrounded by at least a portion of the second implantation region, and the source contact window is metal-filled for electrical coupling and to form ohmic contact on the first implantation and the second implantation; and a drain contact window that sinks into at least a portion of the drain region, and the drain contact window is metal-filled for electrical coupling.

2. The structure of claim 1, wherein the first implantation region is above the second implantation region.

3. The structure of claim 1, wherein the first implantation region has the same thickness as the second implantation region.

4. The structure of claim 1, wherein the metal-filled source contact window is electrically coupled with the substrate through the second implantation region of the double implanted source structure.

5. The structure of claim 1, wherein the metal-filled source contact window is electrically coupled with the source region through the first implantation region of the double implanted source structure.

6. The structure of claim 1, wherein the metal-filled drain contact window is electrically coupled with the drain region through an ion implanted region.

7. The structure of claim 1, wherein both the first implanted region and the second implanted region extend along the entire length of the source region.

8. A silicon-on-insulator metallic oxide semiconductor structure comprising:

a substrate having a silicon surface layer separated by a buried oxide layer, the silicon surface layer being doped with ions having a first conductive type;

a gate terminal formed above the substrate;

a source region formed on one side adjacent to the gate terminal, wherein the source region has a double implanted structure including a first implanted region and a second implanted region formed by a first ion implantation with a second conductive type and a second ion implantation with a first conductive type, respectively;

a drain region formed on the other side adjacent to the gate terminal;

a source contact window that passes through the first implantation region and sinks into at least a portion of the second implantation region, but does not contact with the buried oxide layer, the source contact window then being metal-filled for electrical coupling and to form ohmic contact on the first implantation and the second implantation to tie down the substrate; and a drain contact window that sinks into at least a portion of the drain region, the drain contact window then being metal-filled for electrical coupling.

9. The structure of claim 8, wherein the first implantation region is above the second implantation region.

10. The structure of claim 8, wherein the first implantation region has the same thickness as the second implantation region.

11. The structure of claim 8, wherein the metal-filled source contact window is electrically coupled with the substrate through the second implantation region of the double implanted source structure.

12. The structure of claim 8, wherein the metal-filled source contact window is electrically coupled with the source region through the first implantation region of the double implanted source structure.

13. The structure of claim 8, wherein the metal-filled drain contact window is electrically coupled with the drain region through an ion implanted region.

14. The structure of claim 8, wherein both the first implanted region and the second implanted region extend along the entire length of the source region.

15. The structure of claim 8, wherein the first conductive type is P-type and the second conductive type is N-type.

16. The structure of claim 8, wherein the first conductive type is N-type and the second conductive type is P-type.

* * * * *